United States Patent
Lin et al.

(10) Patent No.: US 8,628,998 B2
(45) Date of Patent: Jan. 14, 2014

(54) ANNEALING METHODS FOR BACKSIDE ILLUMINATION IMAGE SENSOR CHIPS

(75) Inventors: Yu-Ting Lin, Tainan (TW); Cheng-Jung Sung, Tainan (TW); Yu-Sheng Wang, Tainan (TW); Shiu-Ko JangJian, Tainan (TW); Wei-Ming You, Taipei (TW); Chih-Cherng Jeng, Madou Township (TW); Ching-Hwanq Su, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/477,897

(22) Filed: May 22, 2012

(65) Prior Publication Data

US 2013/0171766 A1 Jul. 4, 2013

Related U.S. Application Data

(60) Provisional application No. 61/580,917, filed on Dec. 28, 2011.

(51) Int. Cl.
*H01L 21/00* (2006.01)

(52) U.S. Cl.
USPC ............ 438/89; 438/462; 438/464; 438/690; 257/347; 257/440; 257/460; 257/E29.255

(58) Field of Classification Search
USPC .......... 257/347, 440, 460, E29.255; 438/149, 438/462, 464, 690–692
See application file for complete search history.

(56) References Cited

U.S. PATENT DOCUMENTS

| | | | |
|---|---|---|---|
| 5,436,176 A * | 7/1995 | Shimizu et al. | 438/526 |
| 2008/0079108 A1* | 4/2008 | Hsu et al. | 257/460 |
| 2008/0207094 A1* | 8/2008 | Feng et al. | 451/63 |
| 2008/0251876 A1* | 10/2008 | Tishin et al. | 257/440 |
| 2013/0040446 A1 | 2/2013 | Lai et al. | |
| 2013/0043537 A1* | 2/2013 | Arai et al. | 257/347 |

* cited by examiner

*Primary Examiner* — Mark A Laurenzi
(74) *Attorney, Agent, or Firm* — Slater & Matsil, L.L.P.

(57) ABSTRACT

A method includes performing a grinding on a backside of a semiconductor substrate. An image sensor is disposed on a front side of the semiconductor substrate. An impurity is doped into a surface layer of the backside of the semiconductor substrate to form a doped layer. A multi-cycle laser anneal is performed on the doped layer.

16 Claims, 3 Drawing Sheets

ANNEALING METHODS FOR BACKSIDE ILLUMINATION IMAGE SENSOR CHIPS

This application claims the benefit of the following provisionally filed U.S. patent application: Application Ser. No. 61/580,917, filed Dec. 28, 2011, and entitled "Ultra-Shallow Depth Ion Activation Process by Implantation and Laser Anneal," which application is hereby incorporated herein by reference.

BACKGROUND

Backside Illumination (BSI) image sensor chips are replacing front side illumination sensor chips for their higher efficiency in capturing photons. In the formation of the BSI image sensor chips, image sensors and logic circuits are formed on a silicon substrate of a wafer, followed by the formation of an interconnect structure on a front side of the silicon substrate. The interconnect structure includes a plurality of metal layers including bottom metal layer M1 through top metal layer Mtop. A passivation layer is then formed over the interconnect structure.

The formation of image sensor chips also involves a backside grinding, a p-type impurity implantation, and an anneal, which may be a steam anneal. The process is then continued to form backside contact pads, color filters, lenses, and the like, on the backside of the silicon substrate.

The steam anneal requires a high thermal budget, which adversely affects the pixel performance of the photo image sensors. When pixel sizes become increasingly smaller, the requirement to the performance of the devices in the BSI image sensor chips is stricter. For example, the dark currents of the pixels become increasingly more important. The adverse effect of the steam anneal becomes more severe.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A method of forming backside structures of Backside Illumination (BSI) image sensor wafers/chips is provided in accordance with various embodiments. The intermediate stages of the formation of the BSI image sensor wafers/chips are illustrated. The variations of the embodiments are discussed. Throughout the various views and illustrative embodiments, like reference numbers are used to designate like elements.

Figure 1:
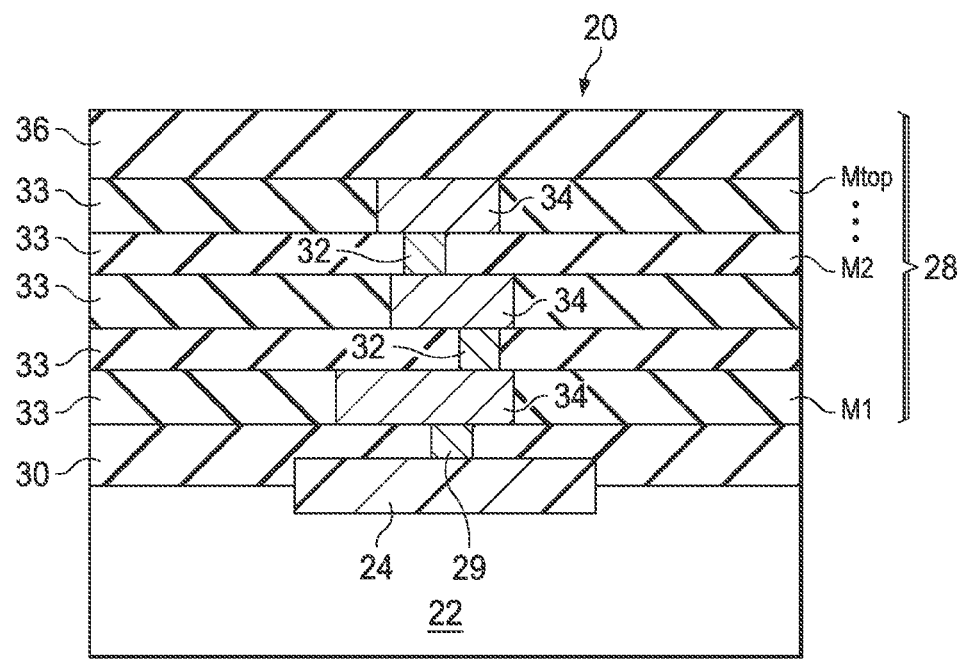
FIGS. 1 through 5 are cross-sectional views of intermediate stages in the manufacturing of a Backside Illumination (BSI) image sensor wafer in accordance with various embodiments.

FIG. 1 illustrates image sensor wafer 20, which includes semiconductor substrate 22. In some embodiments, semiconductor substrate 22 is a crystalline silicon substrate, although it may be formed of other semiconductor materials. Image sensors 24, which may include a photo-sensitive transistor or a photo-sensitive diode, are formed at the front surface of semiconductor substrate 22. Image sensors 24 are capable of converting light to electrical signals.

Interconnect structure 28 is formed over semiconductor substrate 22, and is used to electrically connect to the devices (such as image sensors 24) in image sensor wafer 20. Interconnect structure 28 includes Inter-Layer Dielectric (ILD) 30 formed over semiconductor substrate 22, wherein contact plug 29 is formed in ILD 30.

The metal layers are marked as M1, M2 . . . and Mtop, wherein metal layer M1 is the bottom metal layer of interconnect structure 28, and metal layer Mtop is the top metal layer of interconnect structure 28. The metal layers include metal lines/pads 34 and vias 32 in dielectric layers 33. Image sensors 24 may be electrically coupled to metal lines/pads 34 and vias 32 in metal layers M1 through Mtop. In some embodiments are low-k dielectric layers having low k values, for example, lower than about 3.0 or lower than about 2.5. In alternative embodiments, some dielectric layers 33, in which the metal lines 34 and vias 32 of metal layers M1 through M(top−1) are formed, are low-k dielectric layers, while the dielectric layer 33 in which top metal layer Mtop is located, is a non-low-k dielectric layer having a k value greater than 3.9. Passivation layer 36 is formed over top metal layer Mtop and dielectric layers 33. In some embodiments, passivation layer 36 is formed of an oxide such as Un-doped Silicate Glass (USG), or a composite layer comprising a silicon oxide layer and a silicon nitride layer on the silicon oxide layer.

Figure 2:
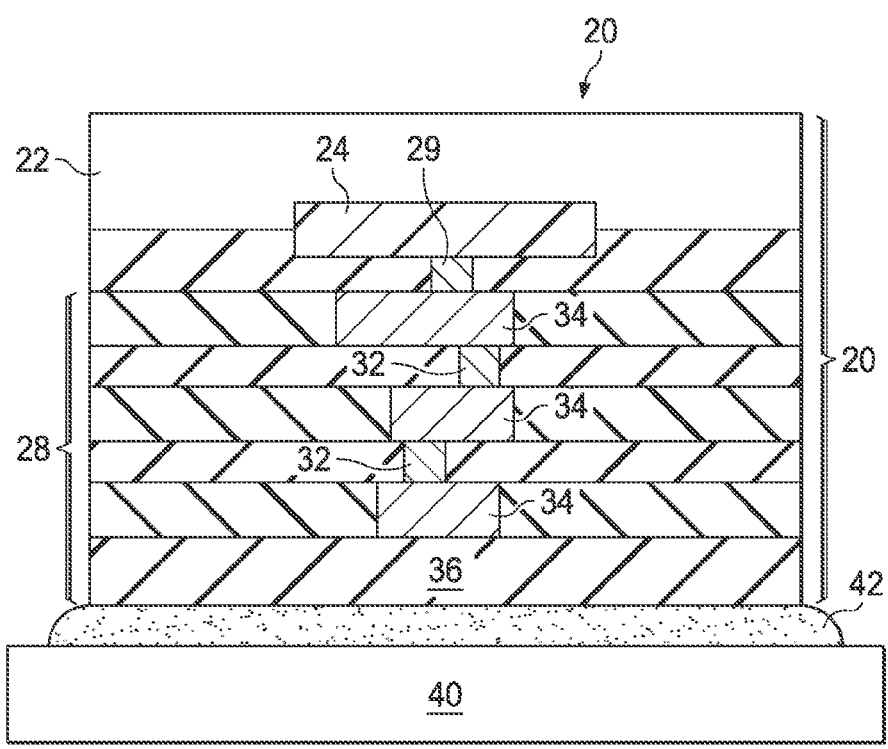

Referring to FIG. 2, the front side (the side with passivation layer 36) of image sensor wafer 20 is attached to carrier 40, for example, through adhesive 42. A backside grinding is then performed to thin semiconductor substrate 22 to a thickness smaller than about 3 μm, for example, and light may penetrate semiconductor substrate 22 from the backside efficiently.

Figure 3:
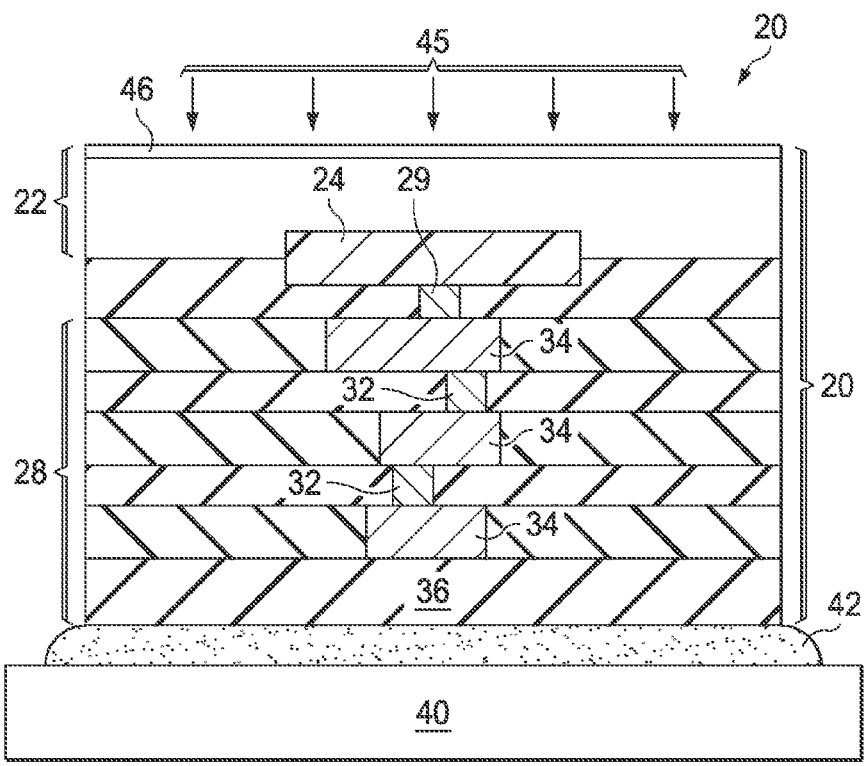

In some embodiments, a first laser anneal is performed after the backside grinding. The first laser anneal may be performed before the ion doping step as shown in FIG. 3. The first laser anneal may eliminate some of the defects resulted in the backside grinding process, in which mechanical and chemical effects may result in the damage in the crystalline structure of substrate 22. In alternative embodiments, the first laser anneal may be skipped, and no laser anneal is performed before the ion doping step.

Referring to FIG. 3, an ion doping step is performed, as symbolized by arrows 45. In some embodiments, the ion doping step results in the doping of a p-type impurity (such as boron or $BF_2$) into a surface layer of semiconductor substrate 22. The lower portion of semiconductor substrate 22 is not doped with the p-type impurity. Throughout the description, the surface layer of semiconductor substrate 22 that is doped with the p-type impurity is referred to as p-type layer 46. The doping may be performed using implantation, plasma immersion ion implantation, plasma doping, film doping, or the like. The exemplary dosage of the implantation may be lower than about $5E13/cm^2$, for example, although higher or lower dosages can be used. When the implantation is used in the doping step, the respective implantation energy may be lower than about 5 keV, for example. With the low energy, the thickness of p-type layer 46 is reduced.

Figure 4:
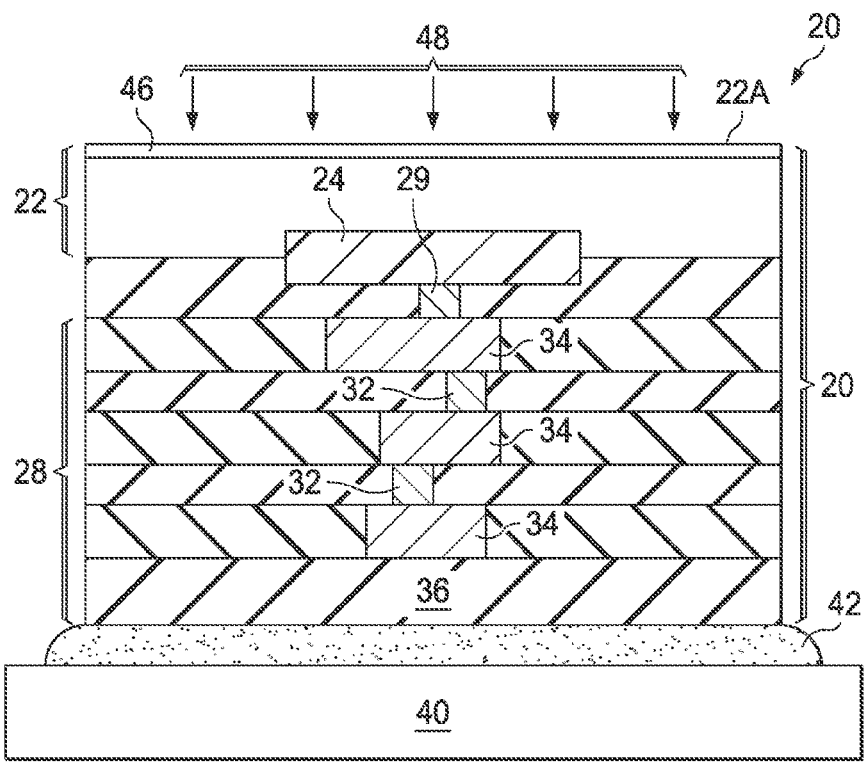

Next, referring to FIG. 4, after the ion doping step, a second laser anneal, as symbolized by arrows 48, is performed to activate the implanted p-type impurity in p-type layer 46. In some embodiments, the anneal is a laser anneal, so that the p-type impurity is activated, while the devices (such as image sensors 24) that are formed at the front surface of semiconductor substrate 22 do not suffer from the thermal budget of the anneal.

Each of the first and the second laser anneals may be performed using a laser, which has a wavelength smaller than about 600 nm. The laser pulse duration may be shorter than about 500 nanoseconds. The laser type may be a solid-state type or an excimer type. Furthermore, each of the first and the second laser anneals may include one or a plurality of cycles, and hence the first and the second laser anneals are also referred to as single-cycle laser anneals or multi-cycle layer anneals.

The function type of the first and/or the second laser anneals may be scan type or stamp type. In the scan type laser anneal, back surface 22A of substrate 22 is scanned, for example, in a row-by-row style, wherein the respective laser spot moves on back surface 22A of wafer 20 continuously. The laser spot is the region of back surface 22A in which the laser is projected. In the stamp type layer anneal, a region of back surface 22A is annealed (stamped) by a laser ray, wherein the respective laser spot does not move when the region is stamped. The laser then steps forward to a neighboring region of p-type layer 26 to perform the anneal. For the scan-type layer anneal and the stamp-type laser anneal, the multi-cycle laser may comprise multi-stage anneals, wherein substantially the entirety of wafer 20 is annealed, and another round(s) of anneal is performed on wafer 20 to scan wafer 20 again. Accordingly, each stage of the multi-stage anneal is a whole-wafer anneal. The stamp-type laser may further be a multi-shot anneal wherein the laser may launch multiple laser shots (for example, multiple laser pulses) on a same region of wafer 20 before stepping forward to another region.

Throughout the description, the step of ion doping and the second laser anneal in combination is referred to as a doping-annealing cycle. In some embodiments, a single doping-annealing cycle is performed. In alternative embodiments, a plurality of doping-annealing cycles is formed, wherein in each of the doping-annealing cycles, an ion doping of the impurity is performed, followed by a laser anneal.

The power of the first and the second laser anneals may be adjusted. In some embodiments, an upper layer of p-type layer 46 is melted or sub-melted, while a lower portion of p-type layer 46 is not melted or sub-melted. In alternative embodiments, an entirety of p-type layer 46 is melted or sub-melted. After the melting, the molten region of p-type layer 46 solidifies again. In yet other embodiments, none of p-type layer 46 is melted or sub-melted.

Figure 5:
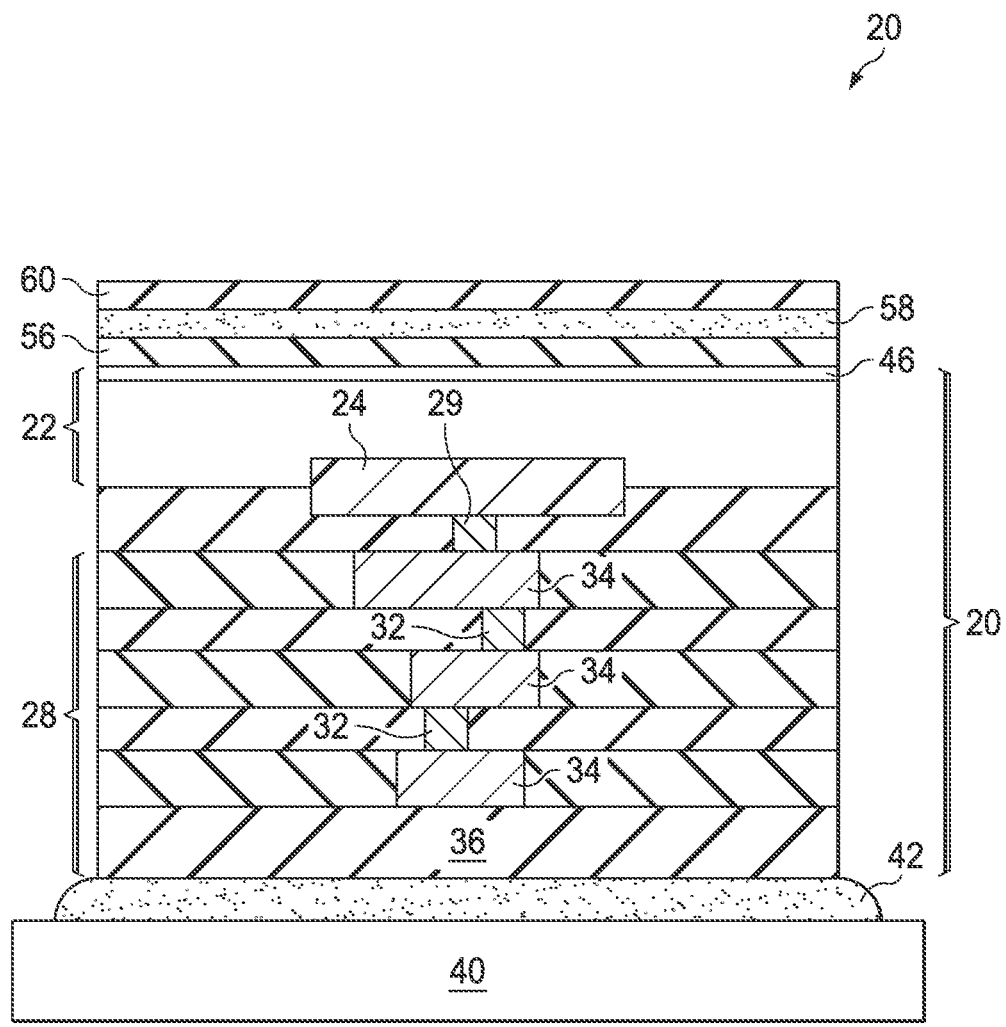

Referring to FIG. 5, after the laser anneal, a plurality of dielectric layers is formed. In some embodiments, buffer oxide layer 56, bottom Anti-Reflective Coating (BARC) 58, and possibly an additional oxide layer 60 are formed. In some exemplary embodiments, buffer oxide layer 56 is formed using a deposition method, which may be Plasma Enhanced Chemical Vapor Deposition (PECVD). BARC 58 may be formed of silicon nitride, silicon oxynitride, and/or the like. Oxide layer 60 may be formed of a Chemical Vapor Deposition (CVD) oxide that is formed using CVD. In subsequent process steps (not shown), a patterning may be performed to etch buffer oxide layer 56, BARC 58, and semiconductor substrate 22 in order to form contact pads, which may be used for wire bonding. After the formation of color filters (not shown), micro-lenses (not shown), and the wire bonding (not shown), light may be projected to penetrate through semiconductor substrate 22 and to reach image sensors 24, which are configured to convert the light into electrical signals.

By using the embodiments, the resulting p-type layer 46 may have improved characteristics. For example, the peak Full Width at Half Maximum (FWHM) obtained at the surface of p-type layer 46 using Raman spectra may be smaller than about 3.6/cm. The surface Haze value may be smaller than about 10 Parts per Million (ppm). Such values may be obtained by increasing the cycles of the first and/or the second laser anneals until the desirable values are achieved. Furthermore, by using the embodiments, the results obtained through Secondary Ion Mass Spectrometry (SIMS) indicated that the flat area of the p-type dopant after the laser anneals is less than about 200 nm, wherein the flat area is the region of p-type layer 46 in which the p-type impurity concentration is substantially unchanged (for example, with a fluctuation less than about 20 percent. Furthermore, the tailing depth of p-type layer 46, in which the p-type doping concentration reduces from the p-type doping concentration in the flat area to one percent of the p-type doping concentration in the flat area, is smaller than 50 nm. These values indicate that by performing the laser anneal in accordance with the embodiments, the p-type dopant is distributed in a very shallow layer. Furthermore, by performing the laser anneal in accordance with the embodiments, the activation rate of the p-type dopant is increased.

In accordance with embodiments, a method includes performing a grinding on a backside of a semiconductor substrate. An image sensor is disposed on a front side of the semiconductor substrate. An impurity is doped into a surface layer of the backside of the semiconductor substrate to form a doped layer. A multi-cycle laser anneal is performed on the doped layer.

In accordance with other embodiments, a method includes performing a grinding on a backside of a semiconductor substrate. A remaining portion of the semiconductor substrate has a back surface. An image sensor is disposed on a front side of the semiconductor substrate. A first laser anneal is performed on the back surface. After the step of performing the first laser anneal, a p-type impurity is doped into a surface layer of the backside of the semiconductor substrate to form a p-type layer. After the step of doping, a second laser anneal is performed on the back surface.

In accordance with yet other embodiments, a method includes performing a grinding on a backside of a semiconductor substrate, wherein a remaining portion of the semiconductor substrate has a back surface. An image sensor is disposed on a front side of the semiconductor substrate. A plurality of doping-annealing cycles is performed on the back surface. Each of the plurality of doping-annealing cycles includes doping a p-type impurity into a surface layer of the backside of the semiconductor substrate to form a p-type layer, and after the step of doping, performing a laser anneal on the back surface.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
performing a grinding on a backside of a semiconductor substrate, wherein a remaining portion of the semiconductor substrate comprises a back surface, and wherein an image sensor is disposed on a front side of the semiconductor substrate;
doping an impurity into a surface layer of the backside of the semiconductor substrate to form a doped layer; and
performing a multi-cycle laser anneal on the doped layer, wherein the multi-cycle laser anneal comprises a multi-stage laser anneal or a multi-shot laser anneal, and wherein:
the multi-stage laser anneal comprises:
performing a first laser anneal on substantially an entirety of a wafer, wherein the wafer comprises the semiconductor substrate; and
after the first laser anneal, performing a second laser anneal on the wafer; and
the multi-shot laser anneal comprises:
projecting a first laser shot on a region of the surface layer; and
after the first laser shot and before projecting laser shots on other regions of the surface layer, projecting a second laser shot on the region.

2. The method of claim 1, wherein the multi-cycle laser anneal is performed after the step of doping the impurity.

3. The method of claim 2 further comprising, after the step of grinding and before the step of doping, performing a laser anneal on the surface layer of the backside of the semiconductor substrate.

4. The method of claim 1, wherein the multi-cycle laser anneal is performed after the step of doping, and wherein the method further comprises, between the first and the second laser anneals, performing an additional doping step to dope the impurity into the surface layer.

5. The method of claim 1, wherein the impurity is of p-type.

6. A method comprising:
performing a grinding on a backside of a semiconductor substrate, wherein a remaining portion of the semiconductor substrate comprises a back surface, and wherein an image sensor is disposed on a front side of the semiconductor substrate;
performing a first laser anneal on the back surface;
after the step of performing the first laser anneal, doping a p-type impurity into a surface layer of the backside of the semiconductor substrate to form a p-type layer, wherein the first laser anneal is performed after the grinding and before any doping step for introducing any p-type impurity into the surface layer is performed; and
after the step of doping, performing a second laser anneal on the back surface.

7. The method of claim 6, wherein one of the first and the second laser anneals comprises a multi-stage anneal, and wherein the multi-stage anneal comprises:
performing a first whole-wafer laser anneal on a wafer, wherein the wafer comprises the semiconductor substrate; and
after the first whole-wafer laser anneal, performing a second whole-wafer laser anneal on the wafer.

8. The method of claim 6, wherein one of the first and the second laser anneals comprises a multi-shot anneal, and wherein the multi-shot anneal comprises:
projecting a first laser shot on a region of the surface layer of the backside of the semiconductor substrate; and
after the first laser shot and before projecting laser shots on other regions of the surface layer, projecting a second laser shot on the region.

9. The method of claim 6, wherein the p-type impurity is selected from the group consisting essentially of boron, $BF_2$, and combinations thereof.

10. The method of claim 6, wherein the step of doping the p-type impurity into the surface layer comprises implanting the p-type impurity, and wherein the implantation is performed with an energy lower than about 5 keV.

11. The method of claim 6, wherein the step of doping the p-type impurity into the surface layer comprises implanting the p-type impurity, and wherein the implantation is performed with a dosage lower than about $5E13/cm^2$.

12. A method comprising:
performing a grinding on a backside of a semiconductor substrate, wherein a remaining portion of the semiconductor substrate comprises a back surface, and wherein an image sensor is disposed on a front side of the semiconductor substrate; and
performing a plurality of doping-annealing cycles on the back surface, wherein each of the plurality of doping-annealing cycles comprises:
doping a p-type impurity into a surface layer of the backside of the semiconductor substrate to form a p-type layer; and
after the step of doping, performing a laser anneal on the back surface, wherein the laser anneal comprises a multi-stage laser anneal or a multi-shot laser anneal, and wherein:
the multi-stage laser anneal comprises:
performing a first laser anneal on substantially an entirety of a wafer, wherein the wafer comprises the semiconductor substrate; and
after the first laser anneal, performing a second laser anneal on the wafer; and
the multi-shot laser anneal comprises:
projecting a first laser shot on a region of the surface layer; and
after the first laser shot and before projecting laser shots on other regions of the surface layer, projecting a second laser shot on the region.

13. The method of claim 12 further comprising, after the grinding and before any doping step for introducing any p-type impurity into the surface layer performing a laser anneal on the surface layer.

14. The method of claim 12, wherein the p-type impurity is selected from the group consisting essentially of boron, $BF_2$, and combinations thereof.

15. The method of claim 12, wherein the step of doping the p-type impurity into the surface layer comprises implanting the p-type impurity, and wherein the implantation is performed with an energy lower than about 5 keV.

16. The method of claim 12, wherein the step of doping the p-type impurity into the surface layer comprises implanting the p-type impurity, and wherein the implantation is performed with a dosage lower than about $5E13/cm^2$.

* * * * *